(12) United States Patent
Pan et al.

(10) Patent No.: US 11,302,788 B2
(45) Date of Patent: Apr. 12, 2022

(54) SEMICONDUCTOR DEVICE AND METHOD OF MANUFACTURING THE SAME

(71) Applicant: Dynax Semiconductor Inc., Kunshan (CN)

(72) Inventors: Pan Pan, Kunshan (CN); Naiqian Zhang, Kunshan (CN); Xi Song, Kunshan (CN); Jianhua Xu, Kunshan (CN)

(73) Assignee: Dynax Semiconductor Inc., Kunshan (CN)

( * ) Notice: Subject to any disclaimer, the term of this patent is extended or adjusted under 35 U.S.C. 154(b) by 0 days.

(21) Appl. No.: 16/685,040

(22) Filed: Nov. 15, 2019

(65) Prior Publication Data

US 2020/0091301 A1   Mar. 19, 2020

Related U.S. Application Data

(63) Continuation of application No. PCT/CN2018/110425, filed on Oct. 16, 2018.

(30) Foreign Application Priority Data

Oct. 16, 2017   (CN) .......................... 201710975386.1

(51) Int. Cl.
| | |
|---|---|
| *H01L 29/778* | (2006.01) |
| *H01L 29/66* | (2006.01) |
| *H01L 29/417* | (2006.01) |
| *H01L 21/285* | (2006.01) |
| *H01L 21/306* | (2006.01) |
| *H01L 29/06* | (2006.01) |
| *H01L 29/423* | (2006.01) |

(52) U.S. Cl.
CPC .... *H01L 29/4175* (2013.01); *H01L 21/28575* (2013.01); *H01L 21/30612* (2013.01); *H01L 29/0696* (2013.01); *H01L 29/42316* (2013.01); *H01L 29/66462* (2013.01); *H01L 29/7786* (2013.01); *H01L 29/7787* (2013.01)

(58) Field of Classification Search
CPC ...................... H01L 29/4175; H01L 29/66462
See application file for complete search history.

(56) References Cited

U.S. PATENT DOCUMENTS

| | | | | |
|---|---|---|---|---|
| 7,417,257 | B2* | 8/2008 | Beach | H01L 29/0692 257/79 |
| 9,589,917 | B1* | 3/2017 | Rodriguez | H01L 23/481 |
| 10,153,273 | B1* | 12/2018 | Tsai | H01L 28/60 |
| 2005/0189587 | A1* | 9/2005 | Ma | H01L 23/481 257/343 |
| 2006/0255360 | A1* | 11/2006 | Brar | H01L 29/66462 257/134 |
| 2007/0045765 | A1* | 3/2007 | Brar | H01L 27/0629 257/481 |
| 2007/0187717 | A1* | 8/2007 | Sadaka | H01L 29/66462 257/192 |

(Continued)

*Primary Examiner* — Grant S Withers
(74) *Attorney, Agent, or Firm* — Flener IP & Business Law; Zareefa B. Flener

(57) ABSTRACT

A semiconductor device, comprising: a semiconductor substrate; a source, a gate and a drain fabricated on one side of the semiconductor substrate; a via hole region reserved in the region of the source; and an etching stopping layer made in the via hole region as well as a via hole under the etching stopping layer penetrating through the semiconductor substrate.

16 Claims, 5 Drawing Sheets

(56) References Cited

U.S. PATENT DOCUMENTS

| | | | |
|---|---|---|---|
| 2008/0067562 A1* | 3/2008 | Kawasaki | H01L 29/4175 257/289 |
| 2009/0001478 A1* | 1/2009 | Okamoto | H01L 21/76898 257/382 |
| 2010/0320505 A1* | 12/2010 | Okamoto | H01L 29/41766 257/192 |
| 2013/0256699 A1* | 10/2013 | Vielemeyer | H01L 29/0653 257/77 |
| 2013/0288401 A1* | 10/2013 | Matsuura | H01L 22/10 438/14 |
| 2014/0209893 A1* | 7/2014 | Okamoto | H01L 29/7787 257/43 |
| 2016/0343809 A1* | 11/2016 | Green | H01L 29/66462 |
| 2018/0212047 A1* | 7/2018 | Chang | H01L 29/66462 |
| 2018/0240753 A1* | 8/2018 | LaRoche | H01L 21/28264 |
| 2018/0240754 A1* | 8/2018 | LaRoche | H01L 29/66462 |
| 2019/0097001 A1* | 3/2019 | LaRoche | H01L 29/45 |
| 2020/0083167 A1* | 3/2020 | LaRoche | H01L 21/28587 |

* cited by examiner

SEMICONDUCTOR DEVICE AND METHOD OF MANUFACTURING THE SAME

CROSS-REFERENCE TO RELATED APPLICATIONS

This application is a continuation of international application No. PCT/CN2018/110425 filed on Oct. 16, 2018, which claims priority of Chinese patent application No. 201710975386.1 filed on Oct. 16, 2017, all contents of which are incorporated herein in their entireties by reference.

TECHNICAL FIELD

The present disclosure relates to the field of microelectronic technologies, and more particularly, to a semiconductor device and a method of manufacturing the same.

BACKGROUND

Compared with the first-generation semiconductor of silicon and the second-generation semiconductor gallium arsenide, the semiconductor material of gallium nitride has apparent advantages such as large band-gap, high electron saturation drift velocity, high breakdown field strength and high temperature performance, which makes it more suitable for electronic devices having high temperature, high pressure, high frequency and high power. Due to the above-mentioned advantages, GaN has broad application prospects and becomes hot research topic in the field of semiconductor industry.

GaN High Electron Mobility Transistor (HEMT) is formed using two-dimensional electron gas at AlGaN/GaN heterojunction and can be applied to the field of high frequency, high voltage and high power. In the process of packaging the gallium nitride device, a structure with via holes is usually used to enhance the device gain and decrease the grounding resistance. Via holes in this kind of structure are usually introduced by etching from the rear side of a substrate, and semiconductor grounding is realized in the way of connecting the rear of the substrate to the ground. Specifically, via holes penetrate the substrate and the nitride semiconductor layer to a source electrode to connect source and the rear of the substrate.

In the present, via holes of the GaN device are distributed mainly in two forms. One form is to open the via holes in the metal PAD region. In this form, via holes are located by the same side of the active region, although decreasing the influence of via holes on the device heat dissipation, also causing integral current direction of the active region being the same and not scattered, thus causing inductance between metal fingers in the source region. In addition, this form also increases the grounding distance of the source in the active region, which means that it increases grounding resistance of the source and therefore has an influence on the device performance such as gain and so on. Another form is to open via holes under the source located in the active region. In this form, each source in active region can be grounded though via holes, therefore grounding distance of the source is decreased and grounding resistance is also reduced. However, in this form, all via holes are opened in active region, which causes that the source OHMIC contacting metal is etched the same time when via holes are being etched. Because the color of OHMIC contacting metal becomes black after being etched and this makes it difficult to estimate how much etching by-product is left in the bottom of the via hole, the difficulty of etching process is increased and performance of device is influenced.

SUMMARY

In view of this, embodiments of the invention aim to provide a semiconductor device and a method of manufacturing the same.

One aspect of the present invention provides a semiconductor device, including: a semiconductor substrate; a source, a gate and a drain fabricated on one side of the semiconductor substrate; a via hole region reserved in the region where the source is located; an etching stopping layer fabricated in the via hole region; and a via hole under the etching stopping layer, which penetrates though the semiconductor substrate.

In one embodiment, the area of the etching stopping layer is smaller than that of the deserved via hole region and there is a gap between the etching stopping layer and the source, so that the source and the etching stopping layer can't contact with each other directly.

In one embodiment, the semiconductor device further comprises a connecting metal covering the source and the etching stopping layer, so that the source and the etching stopping layer could be connected by the connecting metal.

In one embodiment, the etching stopping layer covers the reserved via hole region, so that the source and the etching stopping layer could connect to each other directly.

In one embodiment, the area of the etching stopping layer is larger than the cross-sectional area of the via hole near the side of the semiconductor substrate where the source is disposed.

In one embodiment, the reserved via hole region penetrates at least one end of the source in a direction parallel to the gate to make sure that at least one end of the source is open.

In one embodiment, the reserved via hole region penetrates the source in a direction parallel to the gate to make sure that two ends of the source are open.

In one embodiment, the deserved via hole region is located within the source, so that the source has no openings in the direction parallel to the gate.

In one embodiment, the semiconductor device comprises a plurality of reserved via hole regions in the region corresponding to the source. The plurality of via hole regions are interconnected and penetrate through the source in a direction parallel to the gate, so that both ends of the source are open.

In one embodiment, the semiconductor device comprises a plurality of reserved via hole regions in the region corresponding to the source. The plurality of via hole regions line in sequence in a direction parallel to the gate and the two via hole regions located at both ends of the gate form openings respectively.

In one embodiment, the semiconductor device further comprises a ground electrode disposed on one side of the semiconductor substrate far away from the source. The via hole is filled with conductive material, and the source is connected to the ground electrode through the conductive material in the via hole.

In one embodiment, the semiconductor device comprises an active region. The source, the drain and the gate are located in the active region, the source and the drain being OHMIC contact electrodes and the gate being Schottky contact electrode.

In one embodiment, there are a plurality of sources, a plurality of drains and a plurality of gates in the active region, a plurality sources and a plurality of drains being alternately set and a plurality of gates being set between adjacent sources and drains in an interdigital shape.

In one embodiment, the semiconductor device further comprises a passive region containing a gate pad and a drain pad. The gate pad is connected to a plurality of gates through a gate connecting metal and gate interconnecting wire, and the drain pad is connected to a plurality of drains through a drain connecting metal and drain interconnecting wire.

In one embodiment, the etching selection ratio of the material of the etching stopping layer is larger than that of the semiconductor substrate.

In one embodiment, the material of the etching barrier layer is one metal material or a composite of metal material.

Another aspect of the invention provides a method for manufacturing a semiconductor device, concluding:

providing a substrate; forming a source, a gate and a drain on one side of the semiconductor substrate, deserved via hole region without source metal in it formed in the source region when forming the source; forming an etching stopping layer in the deserved via hole region; and etching to form the via holes penetrating through the semiconductor substrate under the etching stopping layer from the side of the semiconductor substrate far away from the source.

In one embodiment, the steps of forming the deserved via hole region within the source region compromises: covering the deserved via hole region with shielding material on one side of the semiconductor substrate and depositing material on that side to form the source OHMIC metal; and removing the shielding material to form the deserved via hole region.

In one embodiment, the method further comprises making a connecting metal on the side of the source and the etching stopping layer far away from the semiconductor substrate to make the source and the etching stopping layer be connected through the connecting metal.

In one embodiment, the etching selection ratio of the material of the etching stopping layer is larger than that of the semiconductor substrate.

The semiconductor device provided by the embodiment of the invention can reduce the etching damage to the source metal in the via hole region when etching the via hole corresponding to the source in the way of setting a deserved via hole region in the source region and setting an etching stopping layer in the deserved via hole region. Besides, in this way, it is easier to estimate how much the etching is proceeded during the etching process, thus reducing the process difficulty of via hole etching. At the same time, the etching selection ratio of the via hole can also be improved during the etching process and the amount of etching products can be reduced.

To make the objective, features and advantages of the present invention more manifest and understandable, preferred embodiments will be described in detail in conjunction with the appending drawings.

BRIEF DESCRIPTION OF THE DRAWINGS

In order to illustrate the technical solutions of the embodiments of the present invention more clearly, drawings to be used in the embodiments will be briefly described below. It should be appreciated that the following drawings illustrate only certain embodiments of the present invention, and thus they should not be seen as limiting the scope. Other relevant drawings may also be obtained by those skilled in the art according to these drawings without exercise of inventive skills.

Figure 1:
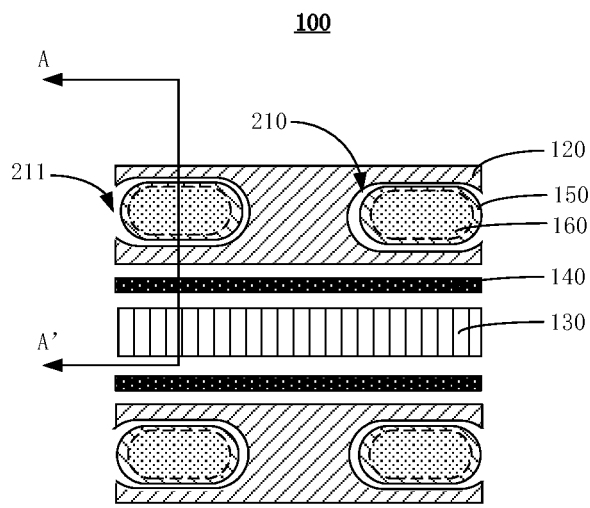
FIG. 1 is a schematic diagram of the location of the source, the drain and the gate.

Reference signs: 100—semiconductor device; 110—semiconductor substrate; 111—substrate chip; 112—epitaxial layer; 120—source; 130—drain; 140—gate; 150—etching stopping layer; 160—via hole; 170—connecting metal; 10—active region; 20—passive region; 180—gate pad; 181—gate connecting metal; 182—gate interconnecting wire; 190—drain pad; 191—drain connecting metal; 192—drain interconnecting wire; 210—deserved via hole region; 211—opening.

DETAILED DESCRIPTION

The technical solutions in the embodiments of the present invention will be clearly and completely described in the following with reference to the accompanying drawings. Obviously, the described embodiments are only a part, other than all, of the embodiments of the invention. The components of the embodiments of the invention, which are described and illustrated in the drawings herein, may generally be arranged and designed in various different configurations. Therefore, the following detailed description of the embodiments of the invention in the drawings is not intended to limit the scope of the present invention, but merely refers to preferred embodiments of the present invention. All other embodiments obtained by those skilled in the art based on the embodiments of the present invention without exercise of inventive skills are within the scope of the present invention.

It should be noted that similar reference numerals and letters indicate similar items in the following drawings.

Therefore, once an item is defined in a drawing, it is not necessary to further define and explain it in the subsequent drawings.

The inventors have found that during etching the via hole corresponding to the source, the source metal and the semiconductor material fuse after high temperature annealing, and part of the metal spread into semiconductor material unevenly. Therefore, there is not a clear interface between the semiconductor and the metal, making it difficult to estimate the end-point of the etching accurately, bringing about very big risk of under etching or over etching, and thus making the process out of control. At the same time, the color of the source alloy may also affect the estimation on the etching result. On another hand, the metal in this region is an alloy metal with relatively high resistance, which affects the current.

Figure 2:
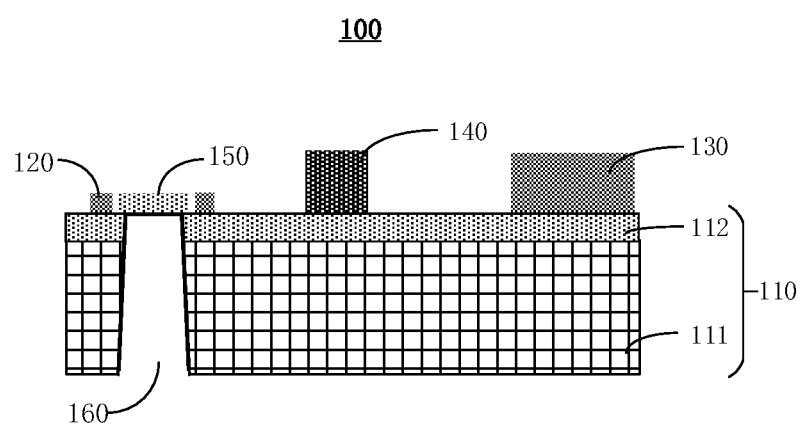
FIG. 2 is the schematic cross-sectional diagram in the direction of A-A' in FIG. 1.

The embodiment of this application provides a semiconductor device 100, as shown in FIG. 1 and FIG. 2, which comprises a semiconductor substrate 110, a source 120, a drain 130, agate 140, an etching stopping layer 150 and a via hole 160.

The semiconductor substrate 110 may include a substrate chip 111 and an epitaxial layer 112 growing on one side of the substrate chip 111. Substrate chip 111 may be formed from one of the materials of silicon, sapphire, silicon carbide, or gallium arsenide. Epitaxial layer 112 may be formed by one or two of gallium nitride or aluminum nitride. It is understandable that the semiconductor substrate 110 may also be formed by substrate chip 111 without epitaxial layer 112.

The source 120, the drain 130 and the gate 140 are fabricated on one side of the semiconductor substrate 110. In the embodiments of this application, a plurality of source 120 and a plurality of drain 130 and a plurality of gate 140 may be fabricated on the semiconductor substrate 110. A plurality of source 120 and a plurality of drain 130 may be set alternately, and a plurality of gate 140 may beset between adjacent source 120 and drain 130 in an interdigital shape. The source 120 and drain 130 may be OHMIC contacting electrode and gate 150 may be Schottky contacting electrode. Gate 140 may be a single-layer metal gate, or a laminate or multi-layer gate structure formed by double layer metal or multi-layer metal.

In the embodiment of this application, via hole region 210 is reserved in the region where the source 120 is located (refer to FIG. 6 if necessary), and the etching stopping layer 150 is fabricated within the reserved via hole region 210. During the process of fabricating the source 120, shielding material may be fabricated within the deserved region 210 firstly. For example, form the via hole region 210 through photolithography, and after that, form OHMIC metal of source 120 through evaporation or sputtering process, and then remove the sheltering material to form the via hole region without OHMIC metal. The source 120 may be formed from one metal material or composite of multiple metal. And the source 120 is made to form OHMIC contact to the semiconductor substrate 110 after high-temperature annealing. After that, form the etching stopping layer 150 through processes such as photography, depositing and etching within the via hole region 210. The material of the etching stopping layer 150 may be one kind of metal or composite of multiple kinds of metal. For example, the etching stopping layer 150 may be formed by one kind of or composite of multiple kinds of gold, tungsten, platinum, titanium and nickel.

In the embodiment provided by this invention, via hole 160 is located under the etching stopping layer 150 and penetrates through the semiconductor substrate 110. The shape of the via hole 160 may be decided according to the practical needs. For example, the cross-sectional shape of the via hole 160 may be a circle, an oval, a square or other shapes. The shape of the via hole 160 is not limited by the embodiments provided by this invention. The shape of the via hole region 210 may correspond to the shape of the via hole 160, being a circle, an oval, a square or other shapes. The quantity of the via hole 160 may be decided according to the practical needs, being one or more.

The etching selection ratio of the material of the etching stopping layer 150 is larger than that of the semiconductor substrate 110 to make sure that the via hole 160 could penetrate though the semiconductor substrate 110 completely and stop at the etching stopping layer 150 when the etching is done in order to avoid damaging or penetrating though the obverse side metal during etching the via hole 160. The cross-sectional shape of the etching stopping layer 150 is similar to the cross-sectional shape of the via hole 160 and its size is related to the practical structure.

Figure 3:
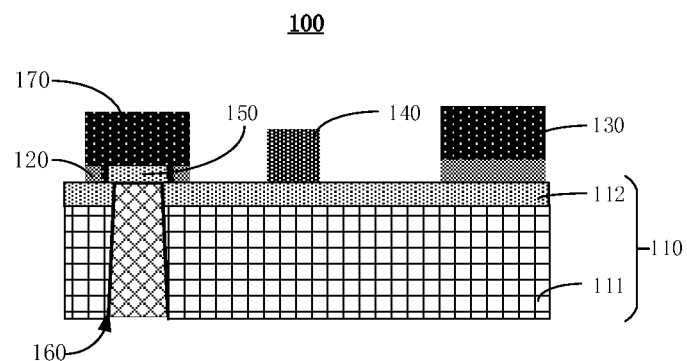
FIG. 3 is a schematic diagram of the OHMIC metal of the source in the semiconductor devices provided by the embodiment of the present invention.

As is shown in FIG. 3, in one embodiment of this application, connecting metal 170 may be covered over the source 120 and the etching stopping layer 150 to make the source 120 and the etching stopping layer 150 be connected through the connecting metal 170. It is understandable that in the embodiment of this application, after the connecting metal 170 is fabricated, the etching stopping layer 150 and the connecting metal layer 170 may be a part of the source or respectively independent parts.

In one embodiment, a grounding electrode may also be fabricated on one side of the semiconductor substrate 110 far away from the source 120, and conductive material can be filled in the via hole 160, so that the source 120 can be connected to the grounding electrode though the conductive material in the via hole 160 to make the source 120 be grounded. In one particular embodiment, the edge of the via hole region 210 along the direction perpendicular to the gate 140 may differ from the corresponding edge of the source 120 formed by fabricating OHMIC metal in a width greater than 3 μm.

Preferably, the etched barrier 150 area is smaller than that of the reserved via hole region 210.

Figure 4:
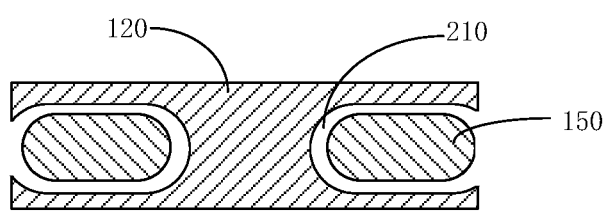
FIG. 4 is a schematic diagram of the position of the source OHMIC metal and the etching stopping layer metal of the semiconductor devices provided by embodiments of the present invention.
Figure 5:
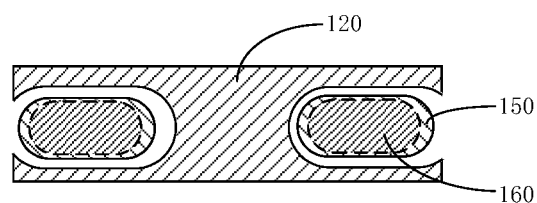
FIG. 5 is one schematic diagram of the location of the source OHMIC metal, the etching stopping layer and the via hole of the semiconductor devices provided by embodiments of the present invention.

In one embodiment, as shown in FIG. 4 and FIG. 5, the area of the etching stopping layer 150 is larger than the cross-sectional (top view) area of the via hole 160 near the side of the semiconductor substrate where the source is set. There is a gap between the etching stopping layer 150 and the source 120 so that the source 120 and the etching stopping layer 150 doesn't contact to each other directly.

In another embodiment, the etching stopping layer 150 may also cover the deserved via hole region 210 to make the etching stopping layer 150 contact to the source 120 directly.

Figure 6:
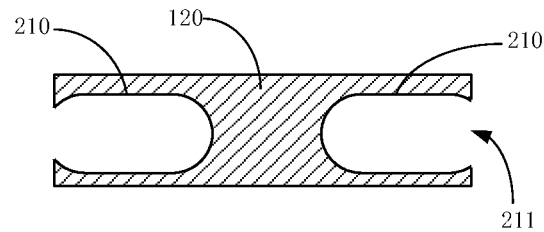
FIG. 6 is another schematic diagram of the source OHMIC metal and the reserved via hole region of the semiconductor devices provided by embodiments of the present invention.
Figure 7:
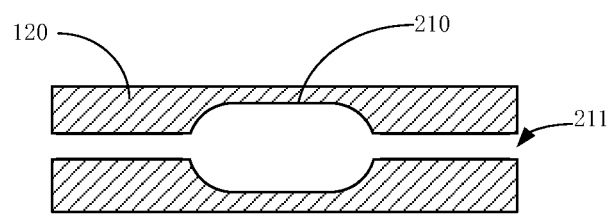
FIG. 7 is another schematic diagram of the source OHIMC metal and the reserved via hole region of the semiconductor devices provided by embodiment of the present invention.
Figure 8:
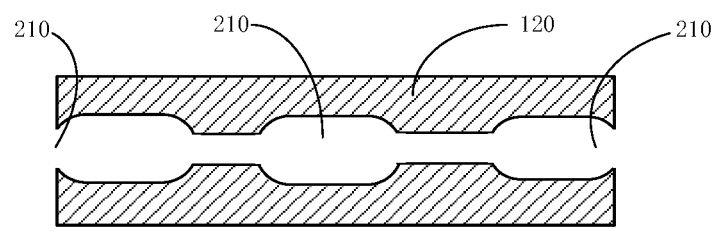
FIG. 8 is another schematic diagram of the source OHIMC metal and the reserved via hole region of the semiconductor devices provided by embodiment of the present invention.

As shown in FIG. 6 to FIG. 8, during the formation of the via hole region 210, in order to make it easier to remove the shielding material covered in the via hole region 210, the via hole region 210 goes through at least one end of the source 120 in the direction parallel to the gate 140 to make sure that least one end of the source is open. The opening 211 formed by the via hole region 210 makes it easier to remove the material such as photoresist in the via hole region 210, and thus reduces the difficulty of the formation of the via hole region 210, and simplifies the manufacturing process of the via hole region 210, and improve the manufacturing efficiency of the semiconductor 100, and reduce the production cost.

The via hole region 210 in the embodiment of this application is the region corresponding to all the via hole 160. The via hole 160 corresponding to the source 120 can be multiple, and the via hole region 210 can be multiple. In each via hole region 210, etching stopping layer 150 corresponding to the via hole 160 is made, and multiple etching stopping layer 150s are independent to each other. For example, the number of via hole 160 can be 1 to 10, correspondently, the number of via hole region 210 can also be 1 to 10, and the number of etching stopping layer 150 can also be 1 to 10.

In detail, as shown in FIG. 7, the via hole region 210 can run through the source 120 left and right in the direction parallel to the gate 140, so that both ends of the source 120 are open. When the number of the via hole region 210 is one, the via hole region forms opening 211 which runs through the source 120 respectively in the direction parallel to the gate 140. Or, as shown in FIG. 6, when there are multiple via hole region 210s, the multiple via hole region 210s can line up in the direction parallel to the gate 140, and the two via hole region 210s on both ends form the opening 211 respectively. Or, as shown in FIG. 8, all via hole region 210s can also be interconnected and penetrate through the source 120 to make both ends of the source 120 are open.

Figure 9:
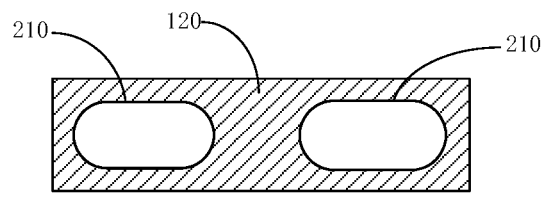
FIG. 9 is another schematic diagram of the source OHIMC metal and the reserved via hole region portion of the semiconductor devices provided by embodiment of the present invention.

As shown in FIG. 9, the reserved via hole region 210 can also be completely located within the OHMIC metal of source 120 to make sure there is no opening on the source, and the via hole region 210 is surrounded by the OHMIC metal formed by fabricating the source.

Figure 10:
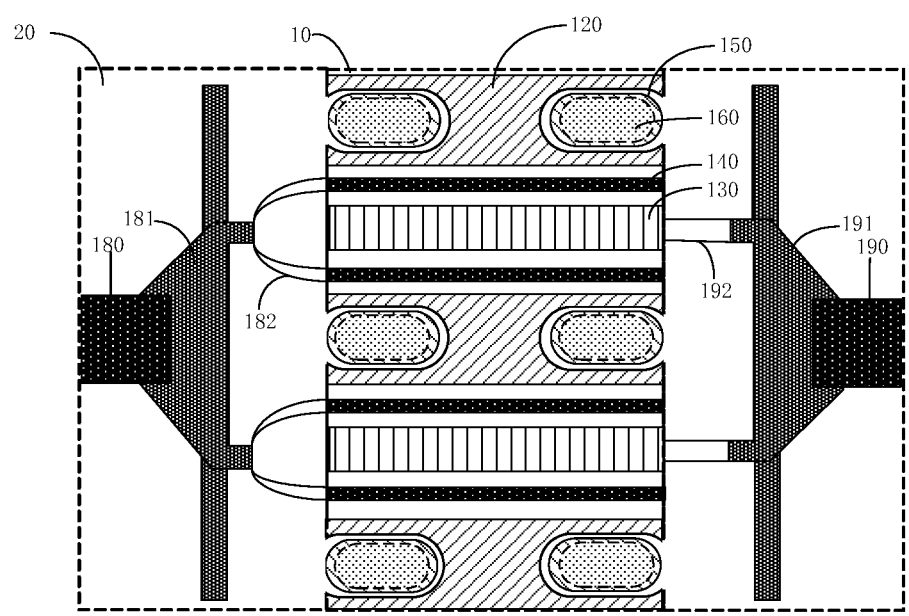
FIG. 10 is a schematic diagram of the semiconductor devices provided by the present invention.

As shown in FIG. 10, the semiconductor device 100 of the embodiment of this application may include an active region 10 and a passive region 20, the source 120, drain 130 and the gate 140 mentioned above being formed within the active region 10. The number of the source 120, drain 130 and the gate 140 mentioned above in the active region 10 may be more than one, and multiple gate pad 180 and drain pad 190 may be formed within the passive region 20. The gate pad 180 may be connected to the gate 140 through the gate connecting metal 181 and the gate interconnecting wire 182, and the drain pad 190 may be connected to the drain 130 through the drain connecting metal 191 and the drain interconnecting wire 192. The gate interconnecting wire 182 and the drain interconnecting wire 192 may be made of metal or other material, and it is not restricted by the embodiment of this application.

Figure 11:
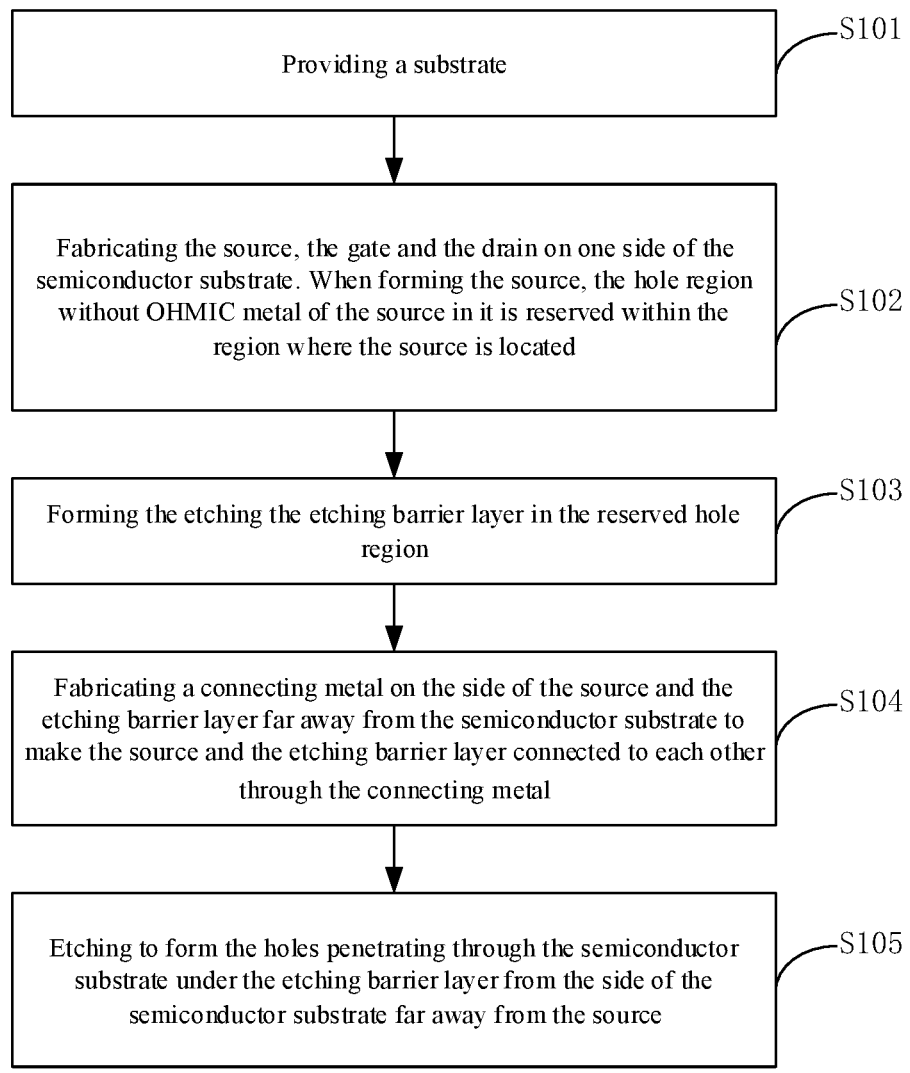
FIG. 11 is a part of the flow chart of the method of manufacturing the semiconductor devices provided by the present invention.

The embodiment of this application also provides a method for manufacturing a semiconductor device, as shown in FIG. 11, including the following steps:

Step S101, providing a semiconductor substrate.

Step S102, fabricating the source, the gate and the drain on one side of the semiconductor substrate. When forming the source, the via hole region without OHMIC metal of the source in it is reserved within the region where the source is located.

Step S103, forming the etching the etching stopping layer in the reserved via hole region.

Step S104, forming the connecting metal over the side of the source and the etching stopping layer away from the semiconductor substrate to make the source be connected to the etching stopping layer through the connecting metal.

Step S105, from the side of the semiconductor substrate away from the source, etching the under-side of the etching stopping layer to form a via hole through the semiconductor substrate.

A connecting metal can be made on the same side of the source and the etching stopping layer far away from the semiconductor substrate, and a pad metal can also be made, so that the source and the etching stopping layer could be connected to each other through the connecting metal and be connected to the pad metal to form a complete device.

When forming the source, the gate and the drain, the source and the drain may be fabricated before the gate is fabricated. The source and the drain are formed on one side of the semiconductor substrate through process such as photolithography, depositing, etching and so on. When forming the source, it is available to cover shielding material such as photoresist over the region where the source is located and the region covered by the shielding material is the via hole region. After forming the source and the drain, it is available to make the source and the drain to form an OHMIC contact with the semiconductor substrate through the method of annealing.

Further, remove the shielding material such as photoresist to form the via hole region. Then form the etching stopping layer within the via hole region through process such as photolithography, depositing, etching and so on. The area of the etching stopping layer is larger than the cross-sectional area of the via hole.

Then, etch and form the via hole from the other side of the semiconductor substrate. During the etching process of the via hole, the etching selection ratio of the etching stopping layer may be larger than that of the semiconductor substrate. There is less etching production produced in the etching process, so it is easier to estimate how much the etching process has been proceeded.

In summary, the semiconductor device provided by the embodiment of the invention can reduce the etching damage to the source metal in the via hole region when etching the via hole corresponding to the source in the way of setting a deserved via hole region in the source region and set an etching stopping layer. Besides, in this way, it is easier to estimate the etching process during the etching process, thus reducing the process difficulty of via hole etching. At the same time, the etching selection ratio can also be improved and the amount of etching products can be reduced, thus the reliability of the device is enhanced.

It should also be noted that in the description of the present invention, unless specified or limited otherwise, the terms "set", "mounted", "connected" and "coupled are used broadly, and may be, for example, fixed connections, detachable connections, or integral connections; may also be mechanical or electrical connections; may also be direct connections or indirect connections via intervening structures; may also be inner communications of two elements. Those skilled in the art can understand the specific meaning of the above terms in the present invention as the case may be.

It should be noted that similar reference numerals and letters indicate similar items in the following drawings. Therefore, once an item is defined in a drawing, it is not necessary to further define and explain it in the subsequent drawings.

In the description of the present invention, it should be noted that the orientation or positional relationship indicated by the terms such as "central", "upper", "lower", "left", "right", "vertical", "horizontal", "inner", and "outer" is based on the orientation or positional relationship shown in the drawings, or the orientation or positional relationship conventionally placed when the product of the present invention is used. The terms are only for the convenience of describing the present invention and simplifying the description, instead of indicating or implying that the device or component referred to must have a particular orientation, constructed and operated in a particular orientation, so they are not to be construed as limiting the invention. Moreover, the terms "first", "second", "third" etc. are used merely for distinction in the description, and they are not to be construed as indicating or implying a relative importance.

The above description refers only to preferred embodiments of the present invention, and is not intended to limit the present invention. For those skilled in the art, various modifications and changes can be made to the present invention. Any modifications, equivalent substitutions, improvements, etc. made within the spirit and scope of the present invention are intended to be included within the scope of the present invention.

What is claimed is:

1. A semiconductor device, wherein the semiconductor device comprises:
    a semiconductor substrate;
    a source, a gate and a drain fabricated on one side of the semiconductor substrate;
    a reserved via hole located within the source;
    an etch stop layer made in the reserved via hole; and
    a via hole under the etch stop layer, which penetrates through the semiconductor substrate,
    wherein there is a gap between the etch stop layer and the source, so that the source and the etch stop layer do not contact with each other directly, wherein the gap is unfilled and wherein the gap is horizontally between an outer sidewall of the etch stop layer and the source, with respect to an upper surface of the substrate.

2. The semiconductor according to claim 1, wherein an area of the etch stop layer is larger than a cross-sectional area of the via hole near the side of the semiconductor substrate where the source is disposed.

3. The semiconductor according to claim 1, wherein the reserved via hole penetrates at least one end of the source in a direction parallel to the gate to make sure that at least one end of the source is an opening.

4. The semiconductor according to claim 3, wherein the reserved via hole penetrates the source in a direction parallel to the gate to make sure that two ends of the source are openings.

5. The semiconductor according to claim 1, wherein the reserved via hole is located entirely within the source, such that the source has no openings in the direction parallel to the gate.

6. The semiconductor according to claim 1, wherein the semiconductor device comprises a plurality of reserved via hole in the source, the plurality of via hole are interconnected and penetrate through the source in a direction parallel to the gate, so that two ends of the source are openings.

7. The semiconductor according to claim 1, wherein the semiconductor device comprises a plurality of reserved via hole in the source, the plurality of reserved via hole are formed in a line in a sequence in a direction parallel to the gate and two via hole of the reserved via hole are located at two ends of the gate form openings respectively.

8. The semiconductor according to claim 1, wherein the semiconductor device further comprises a ground electrode disposed on one side of the semiconductor substrate away from the source, the via hole is filled with conductive material, and the source is connected to the ground electrode through the conductive material in the via hole.

9. The semiconductor according to claim 1, wherein the semiconductor device comprises an active region, the source, the drain and the gate are located in the active region, the source and the drain being ohmic contact electrodes and the gate being a Schottky contact electrode.

10. The semiconductor according to claim 9, further comprising a plurality of sources, a plurality of drains and a plurality of gates in the active region, the plurality sources and the plurality of drains being alternately disposed and the plurality of gates being disposed between adjacent sources and drains among the plurality of sources and the plurality of drains in an interdigital shape.

11. The semiconductor according to claim 1, wherein an etch selection ratio of a material of the etch stop layer is larger than that of the semiconductor substrate.

12. The semiconductor according to claim 1, wherein a material of the etch stop layer is at least one of a metal material or a composite of metal materials.

13. A method of manufacturing a semiconductor device, comprising:
    providing a semiconductor substrate;
    fabricating a source, a gate and a drain on one side of the semiconductor substrate, when forming the source, a reserved via hole without ohmic metal of the source in it is located within the source;
    forming an etch stop layer in the reserved via hole; and
    etching to form via holes penetrating through the semiconductor substrate under the etch stop layer from a side of the semiconductor substrate far away from the source,
    wherein there is a gap between the etch stop layer and the source, so that the source and the etch stop layer do not contact with each other directly, wherein the gap is unfilled and wherein the gap is horizontally between an outer sidewall of the etch stop layer and the source, with respect to an upper surface of the substrate.

14. The method of manufacturing a semiconductor device according to claim 13, wherein the steps of forming the reserved via hole within the source comprises:
    covering the via hole with a shielding material on one side of the semiconductor substrate, and depositing material on the one side of the substrate to form ohmic metal; and
    removing the shielding material to form the reserved via hole.

15. The method of manufacturing a semiconductor device according to claim 13, wherein the method further comprises:
    fabricating a connecting metal on a side of the source and the etch stop layer far away from the semiconductor substrate to make the source and the etch stop layer be connected to each other through the connecting metal.

16. The method of manufacturing a semiconductor device according to 13, wherein an etch selectivity ratio of the etch stop layer is larger than that of the semiconductor substrate.

* * * * *